United States Patent
Teutsch et al.

(10) Patent No.: US 11,828,810 B2
(45) Date of Patent: Nov. 28, 2023

(54) ESTIMATION OF THE SOC OF AN ELECTROCHEMICAL ELEMENT

(71) Applicant: SAFT, Levallois-Perret (FR)

(72) Inventors: François Teutsch, St. Médard d'Eyrans (FR); Erwan Guillonneau, Eysines (FR)

(73) Assignee: SAFT, Perret (FR)

(*) Notice: Subject to any disclaimer, the term of this patent is extended or adjusted under 35 U.S.C. 154(b) by 46 days.

(21) Appl. No.: 17/628,066

(22) PCT Filed: Jul. 13, 2020

(86) PCT No.: PCT/FR2020/051263
§ 371 (c)(1),
(2) Date: Jan. 18, 2022

(87) PCT Pub. No.: WO2021/014072
PCT Pub. Date: Jan. 28, 2021

(65) Prior Publication Data
US 2022/0260644 A1    Aug. 18, 2022

(30) Foreign Application Priority Data

Jul. 19, 2019 (FR) .................... 1908261

(51) Int. Cl.
*G01R 31/3842* (2019.01)
*G01R 31/388* (2019.01)

(52) U.S. Cl.
CPC ....... *G01R 31/3842* (2019.01); *G01R 31/388* (2019.01)

(58) Field of Classification Search
None
See application file for complete search history.

(56) References Cited

U.S. PATENT DOCUMENTS

| | | | |
|---|---|---|---|
| 8,999,582 B2 | 4/2015 | Tessier et al. | |
| 2016/0211679 A1* | 7/2016 | Rabbers | H01M 10/4264 |

FOREIGN PATENT DOCUMENTS

| | | |
|---|---|---|
| DE | 102012206893 A1 | 4/2012 |
| EP | 2269954 A1 | 1/2011 |
| EP | 3182552 A1 | 6/2017 |

OTHER PUBLICATIONS

The Intellectual Property Office of the Republic of France—Search Report, pertaining to FR Application No. 1908261, dated Apr. 29, 2020, 9 pages.

(Continued)

*Primary Examiner* — Jas A Sanghera
(74) *Attorney, Agent, or Firm* — Sunstein LLP (57) ABSTRACT

The present invention concerns a method for estimating the state of charge (SoC) of an electrochemical element. The method comprises the initiation of an operation charging or discharging the electrochemical element that is traversed by a current and, while the charging or discharging operation is taking place: an operation charging or discharging a power storage element that is traversed by the same current as the electrochemical element, the power storage element having a voltage/charge level relationship that is bijective for at least two values of the voltage at the terminals of the storage element, the capacity CES of the storage element representing a portion of the total capacity of the electrochemical element; detection that the storage element is charged or discharged; calculation of a new value of the capacity CN of the electrochemical element by means of the formula CN=CN-I+CES for a charging operation and CN=CN-1−CES for a discharging operation, in which CN-1 is a previous known value of the capacity of the electrochemical element.

20 Claims, 6 Drawing Sheets

(56) References Cited

OTHER PUBLICATIONS

International Searching Authority—International Search Report, pertaining to International Application No. PCT/FR2020/051263, dated Aug. 28, 2020, together with the Written Opinion of the International Searching Authority, 12 pages.

* cited by examiner

ESTIMATION OF THE SOC OF AN ELECTROCHEMICAL ELEMENT

CROSS-REFERENCE TO RELATED APPLICATIONS

This application is the national phase entry of International Patent Application No. PCT/FR2020/051263 filed on Jul. 13, 2020, and claims the benefit of Patent Application No. FR1908261 filed Jul. 19, 2019, the disclosures of which are incorporated herein by reference in their entirety.

FIELD OF THE INVENTION

The present invention relates to the technical field of methods, systems and programs for estimating the charge (SoC) of an electrochemical element for which measuring the voltage does not allow a continuous precise estimate of its state of charge.

TECHNICAL FIELD

An electrochemical generator or accumulator or element is an electricity-producing device in which chemical energy is converted into electrical energy. The chemical energy is made up of electrochemically active compounds arranged in the element. The electrical energy is produced by electrochemical reactions during discharging of the element. The electrodes, arranged in a container, are electrically connected to current output terminals that ensure electrical continuity between the electrodes and an electrical consumer with which the element is associated.

Typically, a battery comprises a plurality of elements that may be grouped together within a same enclosure. A battery may be divided into modules, each module being made up of a plurality of elements connected to one another in series and/or in parallel. The battery is intended to supply electrical energy to an outside application. A charging circuit is generally provided to which the battery may be connected to recharge the elements. A management system comprising measuring sensors and an electronic control circuit, more or less developed depending on the applications, may be associated with the battery.

Standards are known for computing the state of charge (SoC, acronym for State of Charge) of an element, and by extension of a battery. The SoC is the quantity of energy available in the battery relative to the energy of a fully charged battery. Typically, it is expressed as a percentage and reflects the portion of energy remaining available to the user. At this time, most standards for computing the SoC are based on a continuous measurement of voltage-current-temperature data. For example, the following two computation methods may be used, which alternate successively. The main method is coulometric, that is to say, the state of charge depends directly on the ampere-hour metering and the capacity of the battery. However, this method is very sensitive to current measuring errors as well as errors in measuring the capacity. Voltage drifts may occur if this method is used alone. The second method is generally based on voltage measurement and uses a state of charge table as a function of the open circuit voltage. However, this second method is sensitive to the estimation of the resistance, and a resistance estimation error will cause an estimation error of the open circuit voltage (OCV), and therefore estimation error of the SoC.

Elements are also known whose technology is characterized by an OCV curve as a function of the SoC that has a gradual slope because it has at least one zone where the variation of the OCV as a function of the SoC varies little and/or may be non-unique; it is impossible to associate a voltage measurement with a state of charge. The OCV curve as a function of the SoC may be non-unique, that is to say, there are two points of the curve that have the same y coordinate but a different x coordinate. Document EP-A-2, 269,954 describes examples of such elements for which the variation of the no-load voltage as a function of the state of charge has a zone for a state of charge comprised between about 30 and about 90% in which the no-load voltage increases at least 10 times less quickly on average as a function of the state of charge than for a state of charge comprised between 90% and 100%. Such elements are known as flat profile electrochemical elements, or more simply as flat profile elements. Aging will cause changes in the relationship between the OCV and the SoC.

For such flat profile elements, in the zones where the growth of the OCV curve as a function of the SoC is slow, it is not possible to calibrate the SoC on the voltage, the uncertainty regarding the measurement being too great. The computation of the SoC is therefore purely coulometric there. It is known that the provided state of charge information is precise enough for part (called zone 4) of the OCV curve as a function of the SoC corresponding to an SoC comprised around 90 to 100%. Even if the capacity is estimated correctly, the current measurement error limits the number of cycles authorized without calibration in this zone 4. The current methods for managing such elements comprise recalibrating the SoC information on the voltage in zone 4, with low current so as to minimize the uncertainty on the resistance value. For some applications, this may require regular full charging, which is in particular not suitable for hybrid applications such as railway or bus applications, which carry a daily constraint. It is also possible to recalibrate in Zone 1 of the OCV curve as a function of the SoC; zone 1 corresponds to an SoC comprised around 0 to 30%. However, this involves knowing the error committed on the SoC by coulometry near the end of discharging.

Therefore, there is currently no method capable of being adapted in a satisfactory manner to estimating the state of charge of an electrochemical element, and particularly when the electrochemical element is a flat profile element.

BRIEF DESCRIPTION OF THE INVENTION

The present invention proposes a method for estimating the state of charge (SoC) of an electrochemical element. The method for estimating the SoC comprises initiating an operation charging or discharging the electrochemical element that is traversed by a current;

during the operation charging or discharging the electrochemical element:

an operation charging or discharging a power storage element that is traversed by the same current as the electrochemical element, the power storage element having a voltage/charge level relationship that is bijective for at least two values of the voltage at the terminals of the storage element, the capacity $C_{ES}$ of the storage element representing a portion of the total capacity of the electrochemical element;

detecting that the storage element is charged or discharged;

computing a new value of the capacity $C_N$ of the electrochemical element by means of the formula:

for a charging operation: $C_N = C_{N-1} + C_{ES}$;

for a discharging operation: $C_N = C_{N-1} - C_{ES}$;

where $C_{N-1}$ is a previous known value of the capacity of the electrochemical element.

Such a method improves the estimation of the SoC of an electrochemical element because it is based on split measurements of a power storage component whose capacity represents a fraction of the total capacity of the electrochemical element to be evaluated. The SoC is evaluated (or estimated) on split measurements of the SoC that the method will count according to a current context traversing the battery. The estimation of the SoC is independent of electrical measurements to be done directly or indirectly at the terminals of the electrochemical element because it is done on a storage element that is outside the electrochemical element. The storage element has a voltage/charge level relationship that is bijective for at least two values of the voltage at its terminals, which makes it possible to obtain at least two points for measuring a value of the charge of the storage element irrespective of the charge level of the electrochemical element, and therefore of the electrochemical element by simple counting of the successive charges and discharges of the storage element. Thus, the SoC may be estimated irrespective of the intensity of the current without loss of precision, and it may be done with partial charging or discharging of the element without requiring a maintenance cycle. The method thus makes it possible to allow long cycling on the plateau zones of the electrochemical element without drifts of the SoC related to errors in measuring the current on the plateau zones.

According to various embodiments, any combination of at least one of the following features may be implemented:
- following the detection that the storage element is charged or discharged, a polarity inversion at the terminals of the storage element causing discharging of the storage element if the storage element is charged and charging of the storage element if the storage element is discharged, an iteration of the charging or discharging of the storage element, detection and computation;
- the polarity inversion comprises sending a configuration command for switching elements of an electronic H-bridge structure, on which electronic structure the storage element is connected;
- selecting a first configuration command of the switching elements after detecting that the storage element is charged; selecting a second configuration command of the switching elements after detecting that the storage element is discharged;
- further comprising computing a first SoC value of the electrochemical element by a first formula $SoC = SoC_{initial} + 100*(C_N/C_T)$ where $C_T$ is the maximum capacity of the electrochemical element, $SoC_{initial}$ is an SoC value obtained with the formula $SoC_{initial} = 100*(C_{N-1}/C_T)$ where the previous known value $C_{N-1}$ is the capacity of the electrochemical element measured in the bijective part of the SoC curve of the electrochemical element when initiating a charging or discharging operation;
- computing the SoC value of the electrochemical element comprises computing a second formula $SoC = SoC_{initial} + 100*(C_N/C_T) + \alpha*100*(C_{ES}/C_T)$ where $\alpha$ is a charging fraction of the storage element at the instant where the value of SoC is computing;
- successively initiating at least one charging operation and at least one discharging operation of the electrochemical element, or conversely initiating at least one discharging operation and at least one charging operation of the electrochemical element;
- after computing the new value of the capacity $C_N$, storing the capacity $C_N$ as a previous known value $C_{N-1}$;
- while performing the charging or discharging operation, detecting the direction of the current at the terminals of the electrochemical element, and determining that a charging or discharging operation of the electrochemical element is done in the detected current direction;
- detecting that the charged or discharged storage element comprises a voltage measurement $V_C$ at the terminals of the storage element; determining that the storage element is discharged if the measured voltage is substantially zero; determining that the storage element is charged if the measured voltage is substantially equal to a known maximum voltage value;
- after computing the new value of the capacity $C_N$: measuring the voltage $V_{Bat}$ of the electrochemical element; if the measured voltage $V_{Bat}$ is substantially equal to a known minimum voltage $V_{Bat\_Min}$, resetting the value of the previous known value $C_{N-1}$; if the measured voltage $V_{Bat}$ is substantially equal to a known maximum voltage $V_{Bat\_Max}$, setting the previous known value $C_{N-1}$ to the known value of the total capacity $C_T$ of the electrochemical element.

The present invention also proposes a computer program comprising program code instructions for executing the method for estimating the state of charge (SoC) of an electrochemical element.

The present invention also proposes a computer-readable information medium on which the computer program is stored.

The present invention further proposes a system for measuring the state of charge (SoC) of an electrochemical element, comprising a power storage element having a voltage/charge level relationship that is bijective for at least two values of the voltage of the terminals of the storage element and the capacity $C_{ES}$ of which represents part of the total capacity of the element; a detector of the state of charge of the power storage element; a polarity inverter connected to the terminals of the power storage element; a computing unit in communication with the detector and the inverter, and coupled to a memory, the memory storing the computer program and being able to store at least one previous known value of the capacity $C_{N-1}$ of the electrochemical element, a known value of the total capacity $C_T$ of the electrochemical element.

According to various embodiments, any combination with the system of at least one of the following features may be implemented:
- the polarity inverter is an electronic H-bridge structure comprising switching elements; and further comprising a control unit of the switching elements, the control unit being coupled to the detector of the state of charge of the power storage element and comprising a latch coupled to the state of charge detector of the power storage element, the latch being able to receive at least a first signal and a second signal coming from the state of charge detector of the power storage element, the first representing a detection that the storage element is charged and a second signal from the detector representing a detection that the storage element is discharged; to maintain a first output state after receiving the first signal and a second output state after receiving the second signal; drivers of the switching elements, the drivers being coupled to the latch and able to receive the first output state and the second output state, to configure the switching elements according to a first configuration on receiving the first output state and according to a second configuration on receiving the second output state;

the state of charge detector of the power storage element is further able to receive a value of a voltage $V_C$ at the terminals of the storage element, the detector comprising a first voltage comparator able to determine that the voltage $V_C$ is substantially zero; a second voltage comparator able to determine that the voltage $V_C$ is substantially equal to a maximum voltage value $V_{C\_Max}$ stored in the memory;

the power storage element is a supercapacitor;

a detector of the direction of the current of the electrochemical element.

The present invention further proposes an assembly comprising the system for measuring the SoC, an electrochemical element coupled with the system for measuring the SoC.

According to various embodiments, the assembly may also comprise:

the electrochemical element is that of a battery comprising one or more electrochemical elements;

the battery comprises two or more branches, each branch comprising one or several electrochemical elements and being coupled with a system for measuring the SoC.

BRIEF DESCRIPTION OF THE FIGURES

Embodiments of the invention are now described using non-limiting examples of the invention, and in reference to the figures, where.

DETAILED DESCRIPTION OF THE INVENTION

The present invention relates to estimating the state of charge (SoC) of an electrochemical generator, also referred to as an accumulator or an electrochemical element or an element. These terms refer to is an electricity-producing device in which chemical energy is converted into electrical energy and are considered to be synonymous hereinafter.

Open circuit voltage (or no-load voltage) refers to the voltage measured at the terminals of the element when the latter is not drawing any current (according to definition 482-03-32 of standard IEC 60050-482:2004, International Electrotechnical Vocabulary part 482: electrical cells and batteries).

OCV curve as a function of the SoC refers to the variation of the voltage as a function of the state of charge; more simply put, the OCV curve as a function of the SoC is a table that links the OCV measurement points as a function of the SoC values.

The present invention may apply to a particular type of electrochemical element whose OCV curve as a function of the SoC comprises either a curve portion with a gradual slope, and/or a curve portion with a zero slope, and/or a curve portion that is not unique. This type of electrochemical element is also referred to using the expression "flat profile electrochemical element" or more simply "flat profile element"; the flat profile therefore corresponds to the curve portion having the gradual slope, and/or the curve portion having the zero slope, and/or the curve portion that is not unique. More generally, a flat profile electrochemical element is an electrochemical element for which at least part of the variation in the OCV voltage is comprised in the measurement error of the sensor used to measure and/or estimate the OCV, and/or a portion of the curve is not unique.

Figure 1:
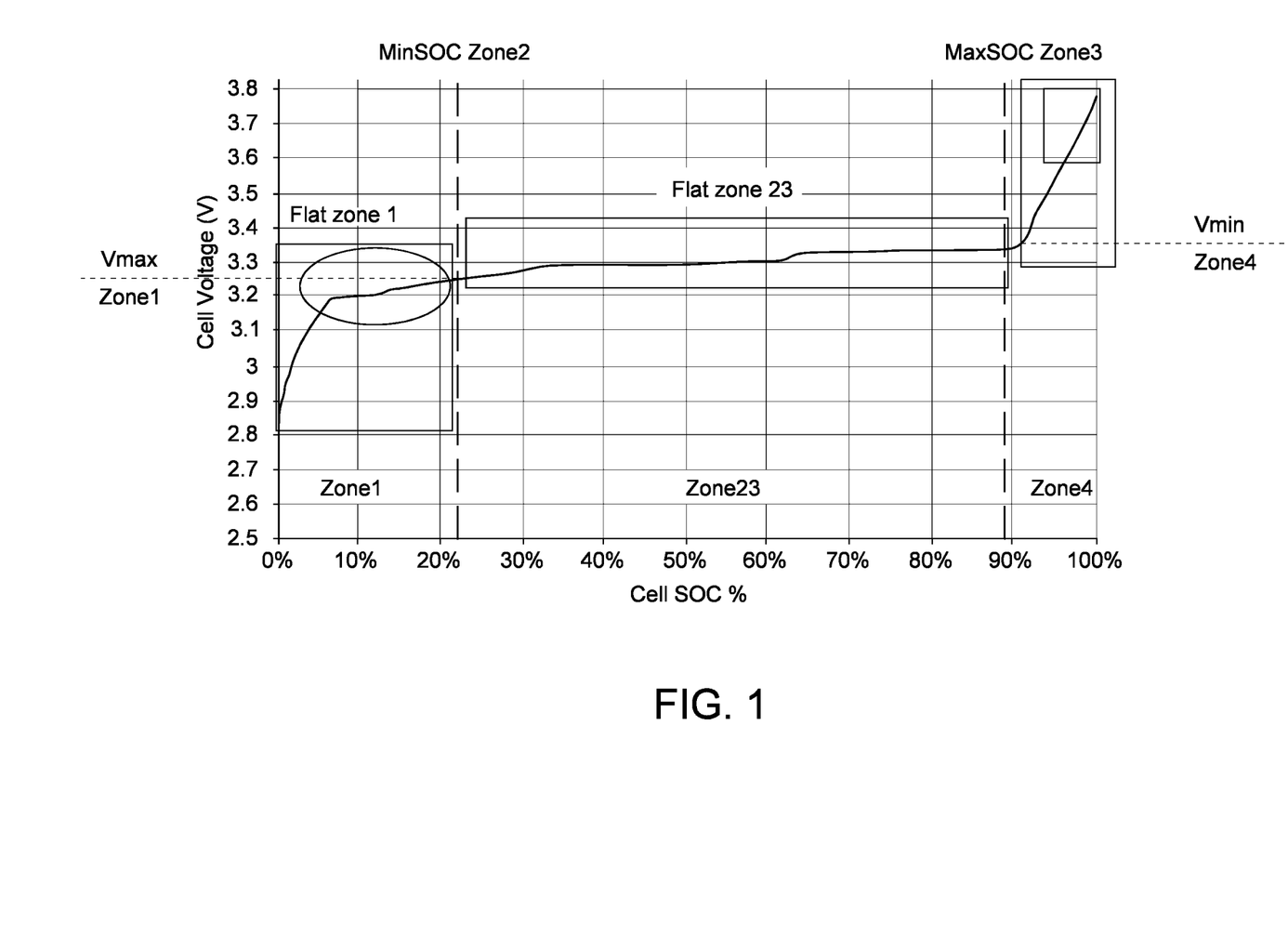
FIG. 1 is an example of an electrochemical element whereof the OCV curve as a function of the SoC comprises a flat zone.

FIG. 1 is a schematic example of an OCV curve as a function of the SoC that has at least one flat profile. In this example, the element is a lithium-ion element whereof a positive electrode comprises an electrochemically active material of the lithium phosphate type or of the type described in document EP-A-2,269,954. In the example of FIG. 1, the curve may be divided into four zones. The measuring precision means that zones 2 and 3 are combined and form a single and same plateau or flat zone (zone 23). The OCV curve as a function of the SoC of zone 23 may be non-unique, that is to say, there are two points of the curve that have the same y coordinate (a same OCV value) but a different x coordinate (at least two different SoC values). Zone 1 also has a plateau, which greatly reduces the sloped zone where a voltage calibration is possible. The plateau of zone 1 is the part of the curve that is circled in FIG. 1; furthermore, this zone 1 may be the most affected by the aging of the element. Zone 4 is the zone that comprises enough of a slope to allow a precise measurement of the state of charge information.

The three main zones shown in FIG. 1 are now discussed in more detail. Zone 1: corresponds to a voltage less than or equal to VmaxZone1. The value VmaxZone1 corresponds to a state of charge equal to MinSoCZone2. VmaxZone1 is generally situated between 3 and 3.30 V and is typically equal to 3.30 V. MinSoCZone2 is generally situated in the range of 15 to 30%, typically 30%. In zone 1, the voltage varies practically in proportion to the state of charge; that is to say, a given voltage of the element corresponds to a given state of charge. Zone 1 is also subdivided into a first state of charge zone comprised between 0 and less than 10%, in which the voltage of the element varies by more than 300 mV and a second state of charge zone comprised between typically 10% and typically 30%, in which the voltage varies less quickly as a function of the state of charge, for example by about 100 mV for an increase in state of charge of 20%. This second charging zone is the curve portion that is circled in FIG. 1.

Zone 23: corresponds to a voltage greater than VmaxZone1 and less than VminZone4. VminZone4 is generally situated between 3.35 and 3.45 V and is typically equal to 3.40 V. The value VminZone4 corresponds to a state of charge equal to MaxSoCZone3. MaxSoCZone3 is generally situated in the range of 80 to 95%, typically 90%. Zone 23 typically corresponds to the voltage zone comprised between 3.30 V and 3.40 V corresponding to a state of charge comprised between typically 20% and typically 90%. A voltage variation of practically zero of the element may be noted for a state of charge comprised between 30% and 60% and for a state of charge comprised between 65% and 90%. In zone 23, the voltage of the element varies little, typically of the order of 100 mV for a state of charge comprised between about 30 and about 90%. This results in considerable imprecision of the state of charge in zone 23, since a given voltage value may correspond to a state of charge comprised in the wide range from 30 to 90%. Zone 23 is subdivided into two subzones; a first sub-zone: zone 2 going from MinSoCZone2 to MaxSoCZone2, or from 22 to 60%, and a second sub-zone, zone 3 going from MinSoCZone3 to MaxSoCZone3, or from 65 to 90%. Zones 2 and 3 come together toward a state of charge comprised between 60 and 65%.

Zone 4: corresponds to a voltage greater than or equal to VminZone4. The value VminZone4 corresponds to a state of charge equal to MaxSoCZone3. VminZone4 corresponds to a state of charge of about 90%. In this zone, the voltage varies in proportion to the state of charge. It varies by about at least 300 mV. A given voltage of the element corresponds to a given state of charge.

The example of FIG. 1 is not limiting in that it only illustrates one example of a flat profile element. In general, a flat profile element is an electrochemical element whose positive active material has a charge profile in which the variation of the voltage as a function of the state of charge between a state of charge greater than MinSoCzone2 corresponding to a predetermined voltage VmaxZone1 and a state of charge less than MaxSoCzone3 corresponding to a voltage VminZone4. The value of the OCV voltage varies between VmaxZone1 and VmaxZone2 and this variation is comprised in the measuring error of a voltage sensor; for example, the precision of the sensor is not sufficient to measure the OCV variations in zone 23.

Examples of estimating the state of charge (SoC) of an electrochemical element are now discussed.

In a first step, a charging operation or a discharging operation of the electrochemical element is initiated. The charging or discharging operation of the electrochemical element is next executed for a duration that depends on the usage conditions of the electrochemical element.

While the charging or discharging operation previously initiated takes place, a charging or discharging operation of a power storage element is performed. The power storage element is also called storage element hereinafter. If the electrochemical element is in charge, the storage element may be in charge or discharge; conversely, if the electrochemical element is in discharge, the storage element may be in charge or discharge.

During charging or discharging of the storage element, the latter is traversed by the same current as the electrochemical element. This means that the current has the same value or a substantially identical value, small variations in value being able to occur, for example due to losses.

The power storage element has a voltage/charge level relationship that is bijective, for at least two values of the voltage at the terminals of the storage element. This therefore means that it is possible to know the state of charge of the storage element for two voltage values.

In examples, a first voltage value for the voltage/charge level relationship that is bijective is a zero or substantially zero voltage value $V_0$ of the storage element, a second voltage value for the voltage/charge level relationship that is bijective is a maximum or substantially maximum voltage value $V_{MAX}$ of the storage element. This first voltage value $V_0$ corresponds to the voltage value for which the storage element is discharged (or in the discharged state), and the second voltage value $V_{MAX}$ corresponds to the voltage value for which the storage element is charged (or in the charged state). It is well known that in the charged state, the current that traverses the storage element is zero.

In examples, the storage element may be a capacitor. In one example, the capacitor is an electrolytic capacitor.

In examples, the storage element may be a supercapacitor. A supercapacitor is a capacitor whose technology makes it possible to obtain a power density and an energy density midway between that of batteries and of conventional capacitors, for example an electrolytic capacitor.

The capacity of the storage element represents a portion of the total capacity of the electrochemical element. A portion of the total capacity of the electrochemical element means a fraction of the total capacity of the electrochemical element. For example, this fraction may be, but is not limited to, $\frac{1}{10}$, $\frac{1}{25}$, $\frac{1}{50}$, $\frac{1}{100}$, $\frac{1}{1000}$, $\frac{1}{10,000}$, etc. of the total capacity of the electrochemical element.

In examples, the total capacity of the electrochemical element may be the total theoretical capacity of the electrochemical element.

In examples, the total capacity of the electrochemical element may be the total measured capacity of the electrochemical element for one or several first charging or discharging operations of the electrochemical element. "One of the first operations" may be a charging or discharging operation relative to an initial state of the electrochemical element. The initial state may be that of a new element, or of an already aged element (that is to say, used), or of a refurbished element (that is to say, for a new use).

Still while the charging or discharging operation previously initiated takes place, it is detected whether the storage element is charged or discharged. It is equivalent to say that the storage element is completely charged, or that the storage element is substantially charged; in all cases, the storage element is considered to be charged when it may no longer accumulate power. Similarly, it is equivalent to say that the storage element is completely discharged, or that the storage element is substantially discharged; in all cases, the storage element is considered to be discharged when no power is stored therein. The detection that the storage element is charged or discharged may be done using standard techniques. Examples are presented below.

After detecting that the storage element is charged or discharged, a new value of the capacity of the electrochemical element is computed. This new capacity is denoted $C_N$. $C_N$ represents the quantity of power stored in the electrochemical element. The computation uses a previous known value of the capacity of the electrochemical element. This previous value is denoted $C_{N-1}$. $C_{N-1}$ represents the quantity of power that was previously stored in the electrochemical element before it is detected that the storage element is charged or discharged.

When a charging operation of the electrochemical element is performed, the charging operation being done at least when it has been detected that the storage element is charged or discharged, the new capacity $C_N$ is computed using the formula (eq. 1)

$$C_N = C_{N-1} + C_{ES} \qquad (\text{eq. 1})$$

When a discharging operation of the electrochemical element is performed, the discharging operation being done at least when it has been detected that the storage element is charged or discharged, the new capacity $C_N$ is computed using the formula (eq. 2)

$$C_N = C_{N-1} - C_{ES} \qquad (\text{eq. 2}).$$

Thus, formulas (eq. 1) and (eq. 2) make it possible to determine the amount of power stored in the electrochemical element at a given moment by using a fraction of the actual capacity of the electrochemical element that is given by the detection that the storage element is charged or discharged. It is therefore understood that the storage element is used to measure an amount of power that has been added to or removed from the storage element.

The storage element may be dynamically recalibrated based on its own aging. Thus, the precision of the results given by formulas (eq. 1) and (eq. 2) is improved, since the actual capacity of the storage element is known.

In examples, it is possible to successively compute one or several new capacities $C_N$ using the method presented above. Each iteration therefore successively comprises a charging or discharging operation of the storage element, detecting that the storage element is discharged or charged, computing the new capacity $C_N$.

Each iteration comprising a charging or discharging operation of the storage element, this means that the storage element must be electrically able to perform a charging operation if it has been previously detected as being discharged or to perform a discharging operation if it has been previously detected as being charged. To this end, on each iteration, an inversion in polarity at the terminals of the storage element is done; the inversion of polarity causes discharging of the storage element if the storage element is charged and charging of the storage element if the storage element is discharged.

For each iteration, the inversion in polarity is done before the charging or discharging operation is launched. For example, it can be done after detecting that the element is charged or discharged.

In examples, an operation may be performed to store the new capacity $C_N$ that has just been computed. In an example, this capacity $C_N$ may be stored as a previous known value $C_{N-1}$.

In the examples where one or several iterations are done, the storage operation is done for each iteration, thus facilitating the computation of the new capacity $C_N$ on each iteration.

In examples, after initiating the charging or discharging operation of the electrochemical element, it may be determined whether the storage element will be charged or discharged based on the direction of the current that traverses the electrochemical element. This can be interesting for the first charging or discharging operation of the storage element that follows the initiation of a charging or discharging operation of the electrochemical element. In an example, a previous known state of charge or discharge of the storage element may be recovered, for example by recovering it in a memory. Thus, if it is known that the storage element is discharged, or if it is charged at less than 50% of its total capacity, it is known that the element must be charged and it is determined, using the current traversing the electrochemical element, whether the storage element is in the process of being charged or discharged. The polarity is inverted if necessary. In another example, if, after having recovered the previous known state of charge or discharge of the storage element, it is known that the storage element is charged, or if it is charged at more than 50% of its total capacity, it is known that the element must be discharged and it is determined, using the current traversing the electrochemical element, whether the storage element is in the process of being charged or discharged. The polarity is inverted, if necessary, so that the storage element discharges.

In examples, the polarity inversion at the terminals of the storage element may be obtained by sending a command to configure switching elements of an electronic structure making it possible to control the polarity at the terminals of the storage element. In an example, the electronic structure may be an H-bridge on which the storage element is connected. The H-bridge is a well-known electronic structure made up of four switching elements that are configured by sending the configuration command.

In examples, the configuration command may comprise a first configuration command and a second configuration command. The first configuration command of the switching elements may be selected after detecting that the storage element is charged, and the second configuration command of the switching elements after detecting that the storage element is discharged. Thus, the first configuration command may be used to command the discharging of the storage element and the second configuration command may be used to command the discharging of the storage element.

In examples, the detection that the storage element is charged or discharged may be done using a measurement of the voltage $V_C$ at the terminals of the storage element. When the voltage $V_C$ measured at the terminals of the storage element is zero or substantially zero ($V_C=V_0$), the storage element is determined as being discharged. Conversely, when the voltage $V_C$ measured at the terminals of the storage element reaches or substantially reaches a known value that is the maximum voltage value ($V_{MAX}=V_C$), the storage element is determined as being charged.

The computation of the estimation of the SoC is now discussed. The estimation of the SoC is expressed as a percentage reflecting the portion of power remaining available for the user of the electrochemical element.

In a first example, a computation of a first SoC value of the electrochemical element is given by the formula (eq. 3)

$$SoC = SoC_{initial} + 100*(C_N/C_T) \quad \text{(eq. 3)}$$

where $C_N$ is the new capacity computed with the formula (eq. 2);
$C_T$ is the total capacity of the electrochemical element;
$SOC_{initial}$ is an SoC value obtained with the formula (eq. 4)

$$SOC_{initial} = 100*(C_{N-1}/C_T) \quad \text{(eq. 4)}$$

where the previous known value $C_{N-1}$ is the capacity of the electrochemical element measured in the bijective portion of the SoC curve of the electrochemical element when the charging or discharging operation is initiated, or when the charging or discharging operation other than the current one is initiated.

The term $SoC_{initial}$ of the formula (eq. 4) thus corresponds to an SoC value previously computed from a previous value $C_{N-1}$ that was measured in a portion of the OCV curve as a function of the SoC that has a sufficient slope to be able to calibrate the SoC on the voltage at the terminals of the electrochemical element. The term $SoC_{initial}$ is therefore a value obtained by calibration, and any method allowing a calibration of the SoC on the voltage of the terminals of the electrochemical element may be used to determine the value of $SoC_{initial}$.

Still regarding the determination of $SoC_{initial}$, it is understood that the calibration of the SoC may be done just before or during the initiation of the charging or discharging operation of the electrochemical element. This may involve initiating a current charging or discharging operation, or a previous charging or discharging operation. In all cases, the calibration will only be done on the bijective part of the SoC curve of the electrochemical element.

As already previously discussed, the total capacity of the electrochemical element $C_T$ may be its total theoretical capacity or its total measured capacity for one or several first charging or discharging operations of the electrochemical element. The total capacity may also be obtained from a measurement done on a complete charging of the empty electrochemical element or on a complete discharging of the full electrochemical element.

In a second example of computing the SoC, the computation done in the first example is refined by adding the term of the formula (eq. 5) to eq. 3:

$$\alpha*100*(C_{ES}/C_T) \quad \text{(eq. 5)}$$

where $\alpha$ is a charging fraction of the storage element, and $C_{ES}$ is the (total) capacity of the storage element, which may be the actual total capacity of the storage element measured after a calibration, or the theoretical total capacity of the storage element. Lastly, $C_{ES}$ may also be obtained from a measurement done on a complete charging of the empty storage element or on a complete discharging of the full storage element.

In this second example, the value of SoC is given by formula (eq. 6)

$$SoC = SoC_{initial}100*(C_N/C_T) + \alpha*100*(C_{ES}/C_T) \quad \text{(eq. 6)}.$$

The charging fraction a is an integer comprised between 0 and 1, inclusively. In an example, the charging fraction a is computed using formula (eq. 7)

$$\alpha = V_{Bat}/V_{max} \quad \text{(eq. 7)}$$

where $V_{Bat}$ is the voltage measured at the terminals of the power storage element;

$V_{Bat\_max}$ is the maximum known voltage at the terminals of the power storage element.

For example, if $V_{Bat}=0$, then $\alpha=0$, or then if $V_{Bat}=V_{Bat\_max}$, then $\alpha=1$, or then if $V_{Bat}=0.5\ V_{Bat\_Max}$, then $\alpha=0.5$.

The charging fraction a may be determined when the SoC value is computed; alternatively, the charging fraction a may be determined when the new value $C_N$ is obtained.

In examples, it may be necessary to capture a new state of the electrochemical element, and in particular the empty (i.e., discharged) or full (i.e., charged) states. A new state of the electrochemical element may thus be captured after computing a new value of the capacity $C_N$. The new state of the electrochemical element may be computed by performing the following operations.

In a first step, the voltage $V_{Bar}$ of the electrochemical element is measured. This measurement may be done using any method making it possible to obtain this voltage value $V_{Bat}$.

In a second step, the measured voltage value $V_{Bat}$ is compared with two specific voltage values; the comparison may be done indifferently with either of these two specific values. If the measured voltage $V_{Bat}$ is equal to a known minimum voltage $V_{Bat\_Min}$, the previous known value $C_{N-1}$ is set at zero. In fact, in this case it is considered that the electrochemical element is discharged or substantially discharged, and therefore that the next operation may only be a charging operation of the electrochemical element with $C_{N-1}=0$. Conversely, if the measured voltage $V_{Bat}$ is substantially equal to a known maximum voltage $V_{Bat\_Max}$, the previous known value $C_{N-1}$ is set at the known value of the total capacity $C_T$ of the electrochemical element. In fact, in this case it is considered that the electrochemical element is charged or substantially charged, and therefore that the next operation may only be a discharging operation of the electrochemical element with $C_{N-1}=C_T$.

The method has been presented in the context of a charging or discharging operation of the electrochemical element. It is understood that the method may apply to situations where at least one charging operation and at least one discharging operation of the electrochemical element have been successively initiated, or conversely at least one discharging operation and at least one charging operation of the electrochemical element have been initiated. The method may apply for any combination of succession of charging and/or discharging of the electrochemical element.

Figure 3:
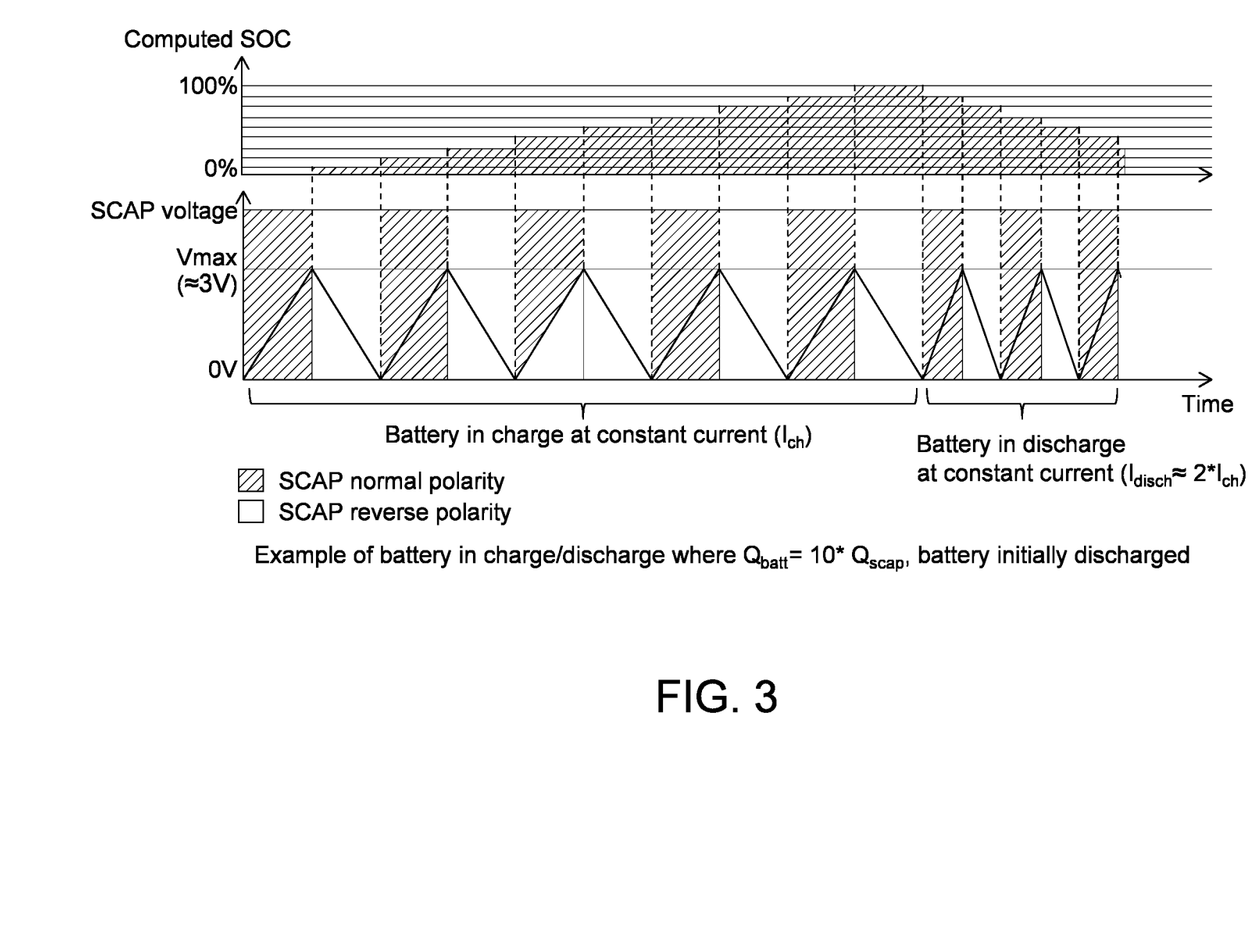
FIG. 3 is an example variation of the SoC of the electrochemical element in relation to the charging and discharging of the storage element.

An example of FIG. 3 is now discussed. The example of FIG. 3 shows, on a first curve, the variations as a function of time of the SoC values computed according to the present invention, and on a second curve, the variations of the voltage at the terminals of the storage element as a function of time. The timescales on the two curves are identical. On the left part of these two curves, the electrochemical element, a battery, is in charge; the battery is in discharge on the right part of the two curves. In this example, the battery is completely empty (discharged) when the charging operation at constant current $I_{ch}$ is initiated, and the battery is completely full (charged) when the discharging operation is initiated at constant current equal to $2*I_{ch}$. During the charging and discharging operations, the voltage at the terminals of the storage element, here a supercapacitor (denoted SCAP), varies between 0 V and $V_{MAX}$; (i) when the SCAP is being charged, the voltage goes from 0 V to $V_{MAX}$; (ii) when the voltage $V_{MAX}$ is reached, the SCAP is charged and a polarity inversion is triggered so as to discharge the SCAP, (iii) when the voltage again reaches 0 V, the SCAP is discharged and a polarity inversion is done so as to charge SCAP; (i), (ii) and (iii) are repeated as long as a charging or discharging operation of the battery is in progress. Each time the polarity changes, a new SoC value is computed. In this example, the supercapacitor represents a fraction of the total maximum capacity of the battery, which is $1/10^{th}$: thus, upon each complete charging or discharging of the supercapacitor, the SoC increases by 10%.

FIG. 3 is a specific combination of the method examples already discussed. In this example, the electrochemical element is a battery and the storage element is a supercapacitor (SCAP).

Figure 4:
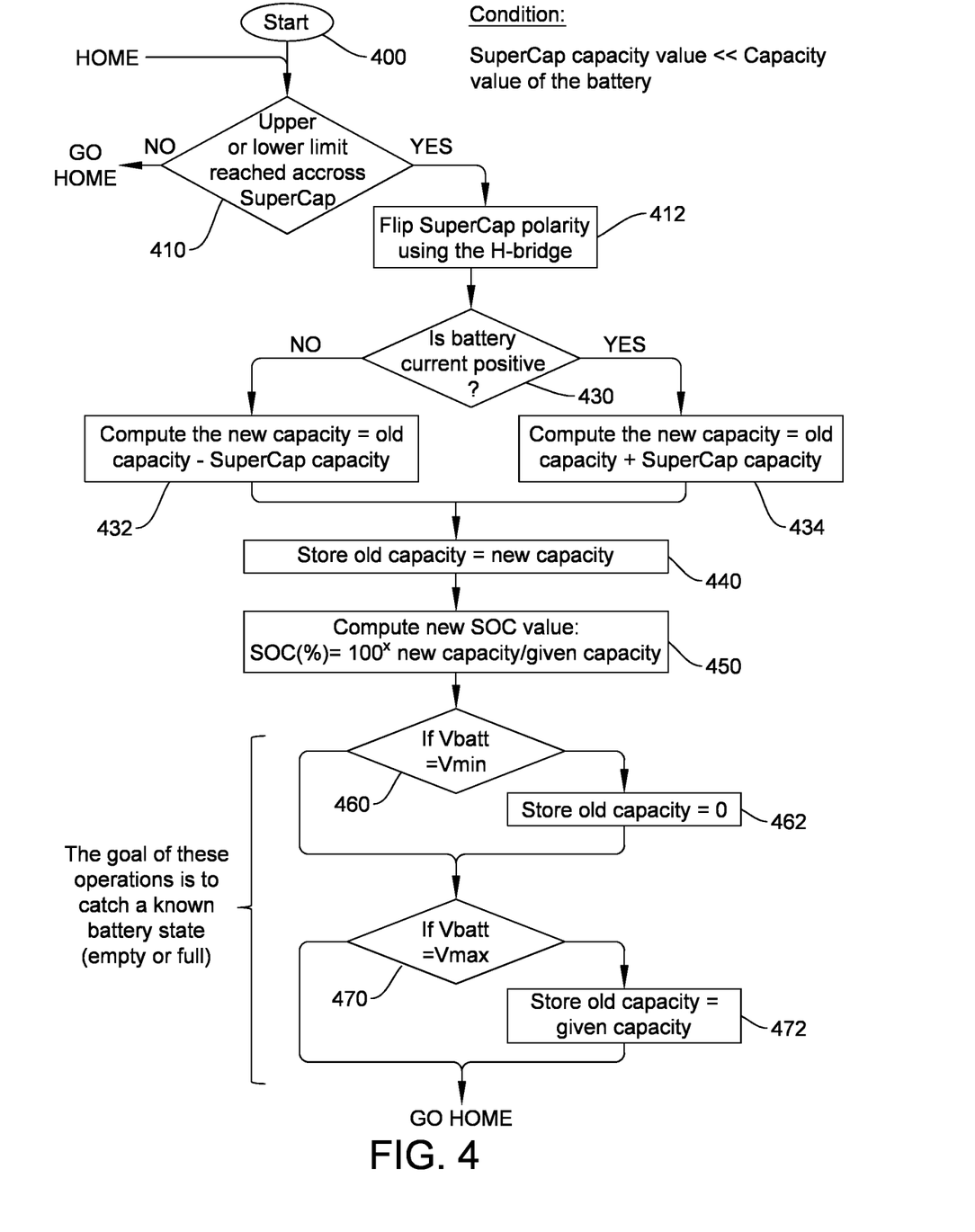
FIG. 4 is an example flowchart of the invention.

In 400, a charging or discharging operation is initiated.

As long as it has not been verified 410 whether the SCAP is charged or discharged, nothing happens. When it has been verified 410 that the SCAP is charged or discharged, the polarity is switched 412 at the terminals of the SCAP.

The new capacity is now computed in steps 430, 432 or 434; it is understood that it could have been computed just after 410. In 430, the direction of the current at the terminals of the battery is verified. If the current is positive, the new value of $C_N$ is computed 434 according to eq. 1. If the current is negative, the new value of $C_N$ is computed 432 according to eq. 2.

Next, the result of the computation of 432 or 434 is stored 440 such that $C_{N-1}=C_N$.

A new SoC value is computed, for example with the formulas given by eq. 3 or eq. 6.

Next, it is tested 460 whether the voltage at the terminals of the battery is minimal, which indicates that the battery is completely discharged. If yes 462, the battery is discharged and one sets $C_{N-1}=0$. If no, $C_{N-1}$ is not modified.

Next, it is tested 470 whether the voltage at the terminals of the battery is maximal, which indicates that the battery is completely charged. If yes 472, one sets $C_{N-1}=C_T$, which is the total capacity of the battery. If no, $C_{N-1}$ is not modified and the method may be repeated.

Figure 6:
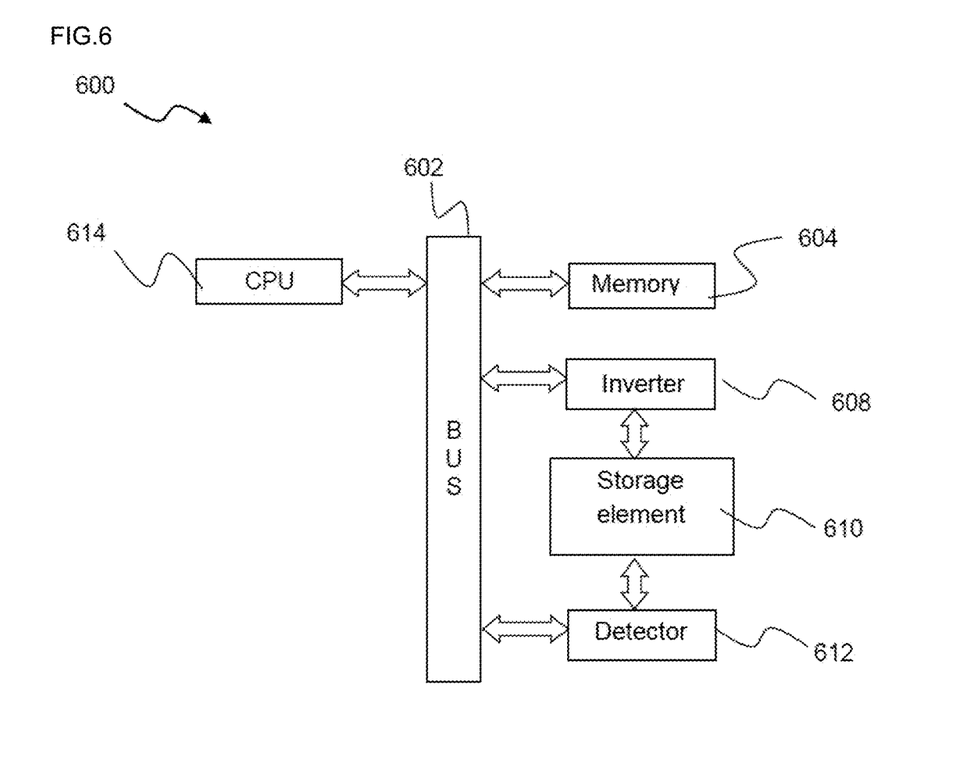
FIG. 6 is an example system for estimating the SoC.

In reference to FIG. 6, an example of a system 600 is now discussed for estimating the SoC of an electrochemical element.

The system comprises a power storage element 610 having a voltage/charge level relationship that is bijective for at least two values of the voltage at the terminals of the storage element and the capacity $C_{ES}$ of which represents a portion of the total capacity of an electrochemical element for which one wishes to estimate the SoC. Such a storage element has previously been discussed, and may for example be a supercapacitor.

The system further comprises a detector 612 of the state of charge of the power storage element. The detector is also called detector of the charged or discharged state of the storage element. The detector is directly or indirectly connected to the storage element, that is to say, the detector is able to receive information concerning the storage element and allowing it to detect the state of charge (charged or discharged state) of the storage element; this information may be transmitted directly from the storage element to the detector, or indirectly via another element of the system 600. The detector carries out one or several of the detection examples previously discussed.

The system also comprises a polarity inverter 608 that is connected to the terminals of the power storage element 610. The polarity inverter makes it possible to control the charging or discharging of the storage element independently of the direction of the current traversing the electrochemical element on which the system measures the SoC. Like the detector, the inverter is directly or indirectly connected to the storage element. The polarity inverter may carry out one or several of the polarity inversion examples previously discussed.

The system also comprises a management unit. The management unit comprises a computing unit (CPU) 614 that is connected to a bus 602 on which a memory 604 is connected. The memory may be a memory making it possible to store the instructions and the data necessary for the operation of a computer program. The memory may be, but is not limited to, a non-volatile memory, for example including semiconductor memories such as EPROM, EEPROM, flash memory, magnetic disks, magnetic-optical discs, CD-ROM, DVD-ROM, Blu-ray Discs©. All these elements may be supported by or incorporated into ASICs (application-specific integrated circuits). The management unit may control the polarity inverter 608; to this end, the polarity inverter may communicate with the management unit via the BUS 602. The management unit may also receive information from the detector 612, such as the results of the detection; to this end, the detector may communicate with the management unit via the BUS 602.

The computer program may comprise instructions that are executable by the management unit. The instructions comprise means for causing the system to execute the method according to the invention. The program may be recordable on any data storage medium, including the memory of the management unit. The program may, for example, be implemented in digital electronic circuits, or in computer hardware, firmware, software or combinations of them. The program may be implemented in the form of an apparatus, for example a product tangibly embodied in a machine-readable storage device for execution by a programmable processor. The steps of the method may be executed by a programmable processor executing a program of instructions to execute functions of the method by operating on input data and generating output. The processor may thus be programmable and coupled to receive data and instructions, to transmit data and instructions to a data storage system, to at least one input device, and to at least one output device. The computer program may be implemented in a high-level procedural or object-oriented programming language, or in assembly or machine language if necessary. In any case, the language may be a compiled or interpreted language. The program may be a full installation program or an update program. The application of the program on the system in any case results in instructions for the execution of the method.

The memory of the system of FIG. 6 stores the computer program, which comprises the program code instructions for the execution of the method for estimating the SoC according to the invention.

The memory is also able to store at least one previous known value of the capacity $C_{N-1}$ of the electrochemical element, as well as a known value of the total capacity $C_T$ of the electrochemical element.

Figure 2:
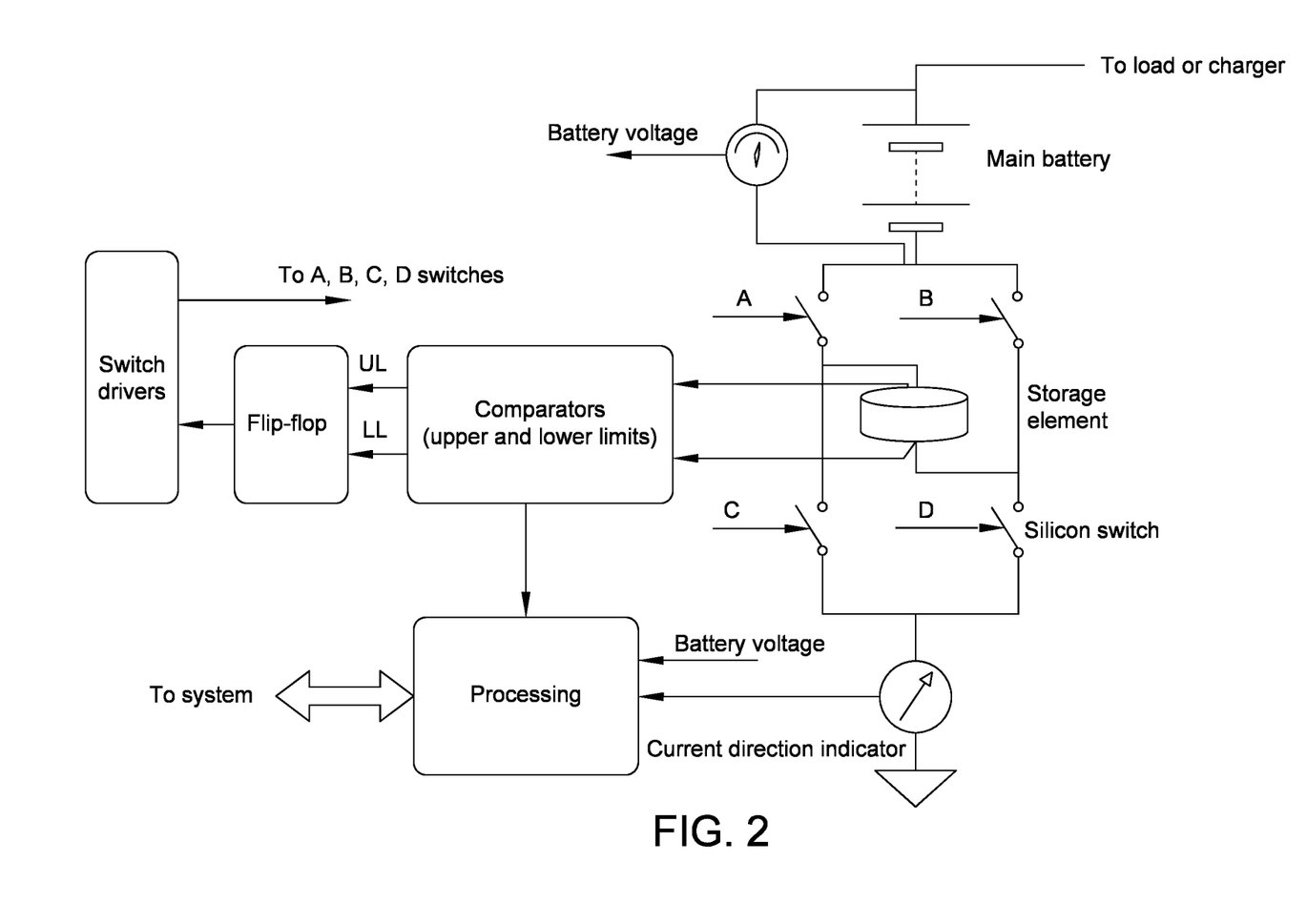
FIG. 2 is an example system according to the invention.

In examples, the polarity inverter is an electronic H-bridge structure that comprises switching elements. FIG. 2 shows such an H-bridge structure on which the power storage element is electrically connected. In this example, the H-bridge comprises four switching elements denoted A, B, C and D.

When the estimating system of the SoC is coupled to an electrochemical element for which one wishes to estimate the SoC, the power storage element is connected to the electrochemical element such that the current that traverses the electrochemical element also traverses the storage element. In FIG. 2, the H-bridge structure is arranged relative to the electrochemical element such that the current that traverses the electrochemical element also traverses the storage element.

In examples, the system for estimating the SoC may also comprise a control unit of the switches of the H-bridge structure. The control unit may be coupled to the state of charge detector of the power storage element such that when the detector detects that the storage element is charged or discharged, the control unit is informed thereof and it may reconfigure the switches of the H-bridge so that they flip the polarity at the terminals of the storage element.

In examples, the state of charge detector of the power storage element is able to detect the state of charge as a function of a voltage $V_C$ at the terminals of the storage element. The detector may be a voltage comparator that is able to receive a value of the voltage $V_C$ at the terminals of the storage element. The detector may comprise a first voltage comparator able to determine that the voltage $V_C$ is substantially zero. The detector may also comprise a second voltage comparator able to determine that the voltage $V_C$ is substantially equal to a maximum voltage value $V_{C\_Max}$. This value of $V_{C\_Max}$ may be stored in the memory 604, or any other memory able to be accessed by the detector. In FIG. 2, the detector produces, as output, a first LL (Low Level) signal indicating that the storage element is discharged, and a second UL (Upper Level) signal indicating that the storage element is charged.

In examples, the control unit of the switches comprises a latch coupled to the state of charge detector of the power storage element. In the example of FIG. 2, the latch is a Flip-Flop latch. The latch is able to receive at least a first signal and a second signal coming from the state of charge detector of the power storage element, the first representing a detection that the storage element is charged and a second signal from the detector representing a detection that the storage element is discharged. The latch is also able to maintain a first output state after receiving the first signal and a second output state after receiving the second signal. In other words, the latch produces at least two output signals that depend on the result of the detection. Each of these at least two signals makes it possible to maintain a certain polarity at the terminals of the storage element. In FIG. 2, the UL signal causes the Flip-Flop latch to produce a first signal that makes it possible to maintain a polarization of the storage element that charges it. The LL signal causes the Flip-Flop latch to produce a second signal that makes it possible to maintain a polarization on the storage element that discharges it.

In examples, the switch control unit may further comprise drivers of the switching elements that are coupled to the latch. The drivers are elements making it possible to control the switches of the polarity inverter. In an example, the drivers may be able to receive the first output state and the second output state that are sent to it by the latch. The drivers are able to configure the switching elements according to a first configuration on receiving the first output state and according to a second configuration on receiving the second output state. In FIG. 2, when the drivers receive the first signal emitted by the latch, they configure the switches so that the H-bridge structure may charge the storage element, for example the switches A and D are closed and the switches B and C are open. Conversely, the drivers will configure A and D open and B and C closed when the latch sends them the second signal.

The management unit of the example of FIG. 2 may receive voltage values at the terminal of the battery, for example to carry out steps 460/462 and 470/472 of FIG. 4. They may also receive the direction of the current in the battery, for example to carry out steps 430/432/434 of FIG. 4. Thus, in examples, the system may comprise a detector of the direction of the current of the electrochemical element. The management unit may also carry out steps 440 and 450 of FIG. 4. In the example of FIG. 2, steps 410/412 and 430 are carried out by separate elements of the management unit. It is understood that the management unit may be capable of performing these functions of detecting whether the storage element is charged or discharged and managing the polarity at the terminals of the storage element.

Figure 5:
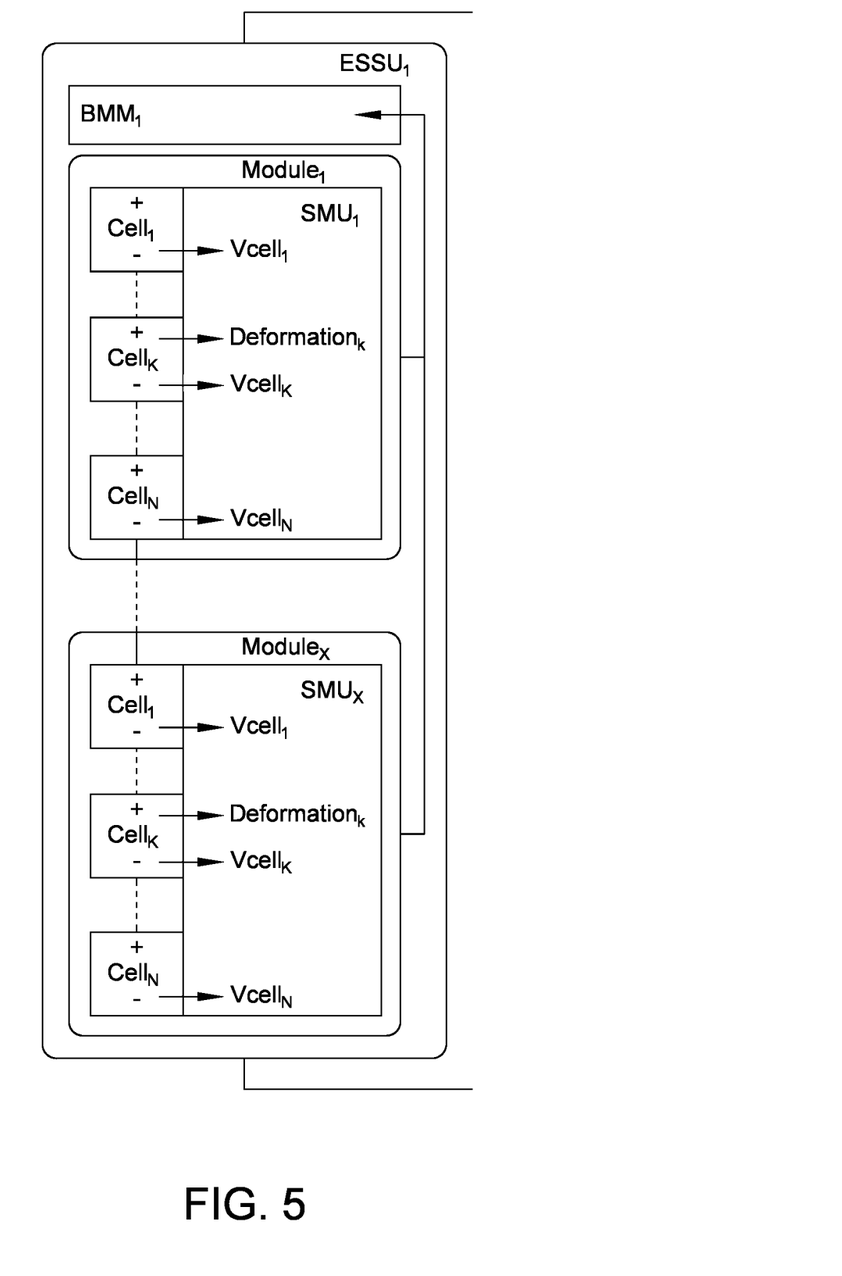
FIG. 5 is an example battery.

FIG. 5 is an example of the configuration of a battery in which N electrochemical elements (Cell1, Cell2, . . . , CellN) are connected in series and arranged together in a same enclosure to form a first module (Module 1). Similarly, N electrochemical elements are connected in series and arranged in a $x^{th}$ enclosure to form a $x^{th}$ module (Modulex). The X modules are connected in series to form a battery (Bat). The X modules constitute a branch of the circuit. The elements are also not necessarily connected in series, but may also be connected in parallel. It is also conceivable to connect certain elements to one another in parallel in order to obtain several associations of elements in parallel, then to connect these associations of elements in series. Likewise, the battery may comprise any number of modules, in a configuration that is not necessarily limited to a connection in series. For example, the battery may comprise p parallel branches, each parallel branch comprising at least one element or at least one module.

Each element may be provided with a means for measuring the voltage at its terminals. Preferably, an element is also provided with a means making it possible to measure its operating temperature. This measuring means is placed at a carefully chosen point of the element so as to have a representation of its average and/or maximum and/or minimum temperature. If the battery comprises a plurality of elements, each element may be provided with a temperature sensor, but this makes the electronic circuits more complex.

The method for evaluating the SoC according to the invention applies to any type of electrochemical element. The method is in particular suitable for electrochemical elements of the type having a no-load voltage (OCV) curve as a function of the state of charge (SoC) comprising a flat zone, the relationship between the state of charge and the open circuit voltage (OCV) being able to be non-bijective. Such elements are for example known from documents EP-A-2,144,075, EP-A-2,239,826 and EP-A-2,309,615, in which lithium phosphates of at least one transition metal are used as positive electrode material of an element, in particular compounds such as $LiMPO_4$, where M is chosen from the group comprising Fe, Co, Ni, Mn and a mixture thereof.

Furthermore, the method according to the invention may apply to any type of electrochemical element, independently of its format. In non-limiting examples, the electrochemical element may assume a cylindrical, prismatic, button or pouch form. In one example, an electrochemical element of the pouch type comprises at least one cell able to comprise a metal plate incorporating a positive electrode, a negative electrode and a separator. Such a cell results from the assembly by juxtaposition of a set of components assuming the form of flexible sheets joined in an envelope, and thus forming an element of the pouch type.

Furthermore, the method according to the invention may also apply to different types of assemblies of batteries. For example, the battery may comprise an electrochemical element, or two or more electrochemical elements, and/or one or several modules. The electrochemical elements and/or the modules of the battery may be mounted in series and/or in parallel. For example, a battery configuration may comprise p branches mounted in parallel, each branch comprising one or several electrochemical elements and/or modules. Each branch may comprise a system for estimating the SoC, and the overall SoC of the system of batteries may for example by computed from the SoC computation done for each branch. For example, the overall SoC is an average value of all the SoC values. Alternatively, a system for estimating the SoC may estimate the SoC for several branches; the system for estimating the SoC may then comprise and manage as many power storage elements, state of charge detectors of the power storage element and polarity inverters connected to the terminals of the storage element as there are branches. A single computing unit may be necessary. A single detector may be necessary for all of the power storage elements.

The invention claimed is:

1. A method for estimating the state of charge (SoC) of an electrochemical element, comprising:
    initiating an operation of charging or discharging of the electrochemical element that is traversed by a current;
    during the operation of charging or discharging of the electrochemical element:
        an operation of charging or discharging of a power storage element that is traversed by the same current as the electrochemical element, the power storage element having a voltage/charge level relationship that is bijective for at least two values of the voltage at the terminals of the storage element, the capacity $C_{ES}$ of the storage element representing a portion of the total capacity of the electrochemical element;
        detecting that the storage element is charged or discharged;
        computing a new value of the capacity $C_N$ of the electrochemical element by means of the formula:
            for an operation of charging: $C_N = C_{N-1} + C_{ES}$;
            for an operation of discharging: $C_N = C_{N-1} - C_{ES}$;
    where $C_{N-1}$ is a previous known value of the capacity of the electrochemical element.

2. The method according to claim 1, further comprising:
following the detection that the storage element is charged or discharged, a polarity inversion at the terminals of the storage element causing a discharging of the storage element if the storage element is charged and a charging of the storage element if the storage element is discharged;
an iteration of the charging or discharging of the storage element, the detection and the computing.

3. The method according to claim 2, wherein the polarity inversion comprises:
sending a configuration command for switching elements of an electronic H-bridge structure, on which electronic structure the storage element is connected.

4. The method according to claim 3, wherein the configuration command comprises:
selecting a first configuration command of the switching elements after the detecting that the storage element is charged;
selecting a second configuration command of the switching elements after the detecting that the storage element is discharged.

5. The method according to claim 1, further comprising computing a first SoC value of the electrochemical element by a first formula:

$$SoC = SoC_{initial} + 100*(C_N/C_T)$$

wherein
$C_T$ is the maximum capacity of the electrochemical element;
$SoC_{initial}$ is an SoC value obtained with the formula $$SoC_{initial} = 100*(C_{N-1}/C_T)$$

wherein
the previous known value $C_{N-1}$ is the capacity of the electrochemical element measured in the bijective portion of the SoC curve of the electrochemical element during an initiation of a charging or discharging operation.

6. The method according to claim 5, wherein the computing of the SoC value of the electrochemical element comprises computing a second formula $$SoC = SoC_{initial} + 100*(C_N/C_T) + \alpha*100*(C_{ES}/C_T)$$

wherein
$\alpha$ is a charging fraction of the storage element at the instant where the value of SoC is computed.

7. The method according to claim 1, further comprising successively initiating at least one operation of charging and at least one operation of discharging of the electrochemical element, or conversely initiating at least one operation of discharging and at least one operation of charging of the electrochemical element.

8. The method according to claim 1, further comprising, after the computing of the new value of the capacity $C_N$:
storing the capacity $C_N$ as a previous known value $C_{N-1}$.

9. The method according to claim 1, further comprising, during the performance of the operation of charging or discharging:
detecting the direction of the current at the terminals of the electrochemical element; and
determining that an operation of charging or discharging of the electrochemical element is done in the detected current direction.

10. The method according to claim 1, wherein the detection that the storage element is charged or discharged comprises:
measuring a voltage $V_C$ at the terminals of the storage element;
determining that the storage element is discharged if the measured voltage is substantially zero;
determining that the storage element is charged if the measured voltage is substantially equal to a known maximum voltage value.

11. The method according to claim 1, further comprising, after the computing of the new value of the capacity $C_N$:
a voltage measurement $V_{Bat}$ of the electrochemical element;
if the measured voltage $V_{Bat}$ is substantially equal to a known minimum voltage $V_{Bat\_Min}$, resetting the value of the previous known value $C_{N-1}$;
if the measured voltage $V_{Bat}$ is substantially equal to a known maximum voltage $V_{Bat\_Max}$, setting the previous known value $C_{N-1}$ to the known value of the total capacity $C_T$ of the electrochemical element.

12. A non-transitory computer-readable data storage medium having recorded thereon a computer program comprising program code instructions for executing a method for estimating the state of charge (SoC) of an electrochemical element, the method comprising:
initiating an operation of charging or discharging of the electrochemical element that is traversed by a current;
during the operation of charging or discharging of the electrochemical element:
an operation of charging or discharging of a power storage element that is traversed by the same current as the electrochemical element, the power storage element having a voltage/charge level relationship that is bijective for at least two values of the voltage at the terminals of the storage element, the capacity $C_{ES}$ of the storage element representing a portion of the total capacity of the electrochemical element;
detecting that the storage element is charged or discharged;
computing a new value of the capacity $C_N$ of the electrochemical element by means of the formula:
for an operation of charging: $C_N = C_{N-1} + C_{ES}$;
for an operation of discharging: $C_N = C_{N-1} - C_{ES}$;
where $C_{N-1}$ is a previous known value of the capacity of the electrochemical element.

13. A system for measuring the state of charge (SoC) of an electrochemical element, comprising:
a power storage element having a voltage/charge level relationship that is bijective for at least two values of the voltage at the terminals of the storage element and the capacity $C_{ES}$ of which represents a portion of the total capacity of the electrochemical element;
a detector of the state of charge of the power storage element;
a polarity inverter connected to the terminals of the power storage element;
a computing unit in communication with the detector and the inverter, and coupled to a memory, the memory storing a computer program comprising program code instructions configured to:
initiate an operation of charging or discharging of the electrochemical element that is traversed by a current;
during the operation of charging or discharging of the electrochemical element:
an operation of charging or discharging of the power storage element that is traversed by the same current as the electrochemical element detect that the storage element is charged or discharged;

compute a new value of the capacity $C_N$ of the electrochemical element by means of the formula:
for an operation of charging: $C_N = C_{N-1} + C_{ES}$;
for an operation of discharging: $C_N = C_{N-1} - C_{ES}$; and store at least one previous known value of the capacity $C_{N-1}$ of the electrochemical element and a known value of the total capacity $C_T$ of the electrochemical element.

14. The system according to claim 13, wherein:
the polarity inverter is an electronic H-bridge structure comprising switching elements; and further comprising:
a control unit of the switching elements, the control unit being coupled to the state of charge detector of the power storage element and comprising:
a latch coupled to the detector of the state of charge of the power storage element, the latch being able to:
receive at least a first signal and a second signal coming from the state of charge detector of the power storage element, the first representing a detection that the storage element is charged and a second signal from the detector representing a detection that the storage element is discharged;
maintain a first output state after receiving the first signal and a second output state after receiving the second signal;
switching drivers, the drivers being coupled to the latch and being able to:
receive the first output state and the second output state;
configure the switching elements according to a first configuration on receiving the first output state and according to a second configuration on receiving the second output state.

15. The system according to claim 13, wherein the state of charge detector of the power storage element is further able to receive a value of a voltage $V_C$ at the terminals of the storage element, the detector comprising:
a first voltage comparator able to determine that the voltage $V_C$ is substantially zero;
a second voltage comparator able to determine that the voltage $V_C$ is substantially equal to a maximum voltage value $V_{C\_Max}$ stored in the memory.

16. The system according to claim 13, wherein the power storage element is a supercapacitor.

17. The system according to claim 13, comprising a detector of the direction of the current of the electrochemical element.

18. An assembly comprising:
a system for measuring the SoC, the system comprising:
a power storage element having a voltage/charge level relationship that is bijective for at least two values of the voltage at the terminals of the storage element and the capacity $C_{ES}$ of which represents a portion of the total capacity of the electrochemical element;
a detector of the state of charge of the power storage element;
a polarity inverter connected to the terminals of the power storage element;
a computing unit in communication with the detector and the inverter, and coupled to a memory, the memory storing a computer program comprising program code instructions configured to:
initiate an operation of charging or discharging of the electrochemical element that is traversed by a current;
during the operation of charging or discharging of the electrochemical element:
an operation of charging or discharging of the power storage element that is traversed by the same current as the electrochemical element detect that the storage element is charged or discharged;
compute a new value of the capacity $C_N$ of the electrochemical element by means of the formula:
for an operation of charging: $C_N = C_{N-1} + C_{ES}$;
for an operation of discharging: $C_N = C_{N-1} - C_{ES}$; and
store at least one previous known value of the capacity $C_{N-1}$ of the electrochemical element and a known value of the total capacity $C_T$ of the electrochemical element;
an electrochemical element coupled with the system for measuring the SoC.

19. The assembly according to claim 18, wherein the electrochemical element is that of a battery comprising one or more electrochemical elements.

20. The assembly according to claim 19, wherein the battery comprises two or more branches, each branch comprising one or several electrochemical elements and being coupled with a system for measuring the SoC.

* * * * *